United States Patent
Tanielian

(10) Patent No.: US 7,880,079 B2
(45) Date of Patent: Feb. 1, 2011

(54) DUAL GAP THERMO-TUNNELING APPARATUS AND METHODS

(75) Inventor: Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 892 days.

(21) Appl. No.: 11/192,638

(22) Filed: Jul. 29, 2005

(65) Prior Publication Data

US 2007/0023077 A1    Feb. 1, 2007

(51) Int. Cl.
*H01L 35/30* (2006.01)
*H02N 10/00* (2006.01)

(52) U.S. Cl. .................. 136/205; 136/224; 310/306; 62/3.7

(58) Field of Classification Search ......... 136/200–242; 310/306; 62/3.7
See application file for complete search history.

(56) References Cited

U.S. PATENT DOCUMENTS

| | | | | |
|---|---|---|---|---|
| 2,992,539 A | * | 7/1961 | Curtis | 62/3.7 |
| 3,169,200 A | * | 2/1965 | Huffman | 310/306 |
| 3,208,835 A | * | 9/1965 | Duncan et al. | 428/620 |
| 3,376,437 A | | 4/1968 | Meyerand et al. | |
| 3,515,908 A | | 6/1970 | Caldwell | |
| 3,564,860 A | * | 2/1971 | Reich et al. | 62/3.7 |
| 3,578,992 A | | 5/1971 | Paine | |
| 3,873,370 A | * | 3/1975 | Hampl et al. | 136/205 |
| 3,978,333 A | * | 8/1976 | Crisman et al. | 136/255 |
| 4,711,971 A | * | 12/1987 | Duncan et al. | 136/211 |
| 4,771,201 A | | 9/1988 | Free | |
| 5,006,178 A | * | 4/1991 | Bijvoets | 136/211 |
| 5,675,972 A | | 10/1997 | Edelson | |
| 5,699,668 A | | 12/1997 | Cox | |
| 5,722,242 A | | 3/1998 | Edelson | |
| 5,810,980 A | | 9/1998 | Edelson | |
| 5,874,039 A | | 2/1999 | Edelson | |
| 5,981,071 A | | 11/1999 | Cox | |
| 5,994,638 A | | 11/1999 | Edelson | |

(Continued)

FOREIGN PATENT DOCUMENTS

DE    3818192 A1    12/1989

(Continued)

OTHER PUBLICATIONS

Hishinuma, et al., "Refrigeration by Combined Tunneling and Thermionic Emission in Vacuum: Use of Nanometer Scale Design", Applied Physics Letters, vol. 78, No. 17, pp. 2572-2573, Apr. 2001.

*Primary Examiner*—Alexa D Neckel
*Assistant Examiner*—Golam Mowla

(57) ABSTRACT

Method and apparatus for improved thermal isolation for thermoelectric devices are disclosed. In one embodiment, a thermoelectric device includes a first substrate portion having a first p-type conductive portion electrically coupled to a first n-type conductive portion, and a second substrate portion having a second p-type conductive portion and a second n-type conductive portion, the second substrate portion being positioned proximate to the first substrate portion such that the first and second p-type conductive portions are approximately aligned and the first and second n-type conductive portions are approximately aligned, wherein the first and second p-type conductive portions are spaced apart to form a first gap, and the first and second n-type conductive portions are spaced apart to form a second gap.

13 Claims, 2 Drawing Sheets

U.S. PATENT DOCUMENTS

| | | | |
|---|---|---|---|
| 6,064,137 | A | 5/2000 | Cox |
| 6,089,311 | A | 7/2000 | Edelson |
| 6,103,298 | A | 8/2000 | Edelson et al. |
| 6,117,344 | A | 9/2000 | Cox et al. |
| 6,214,651 | B1 | 4/2001 | Cox |
| 6,229,083 | B1 | 5/2001 | Edelson |
| 6,281,139 | B1 | 8/2001 | Tavkhelidze et al. |
| 6,281,514 | B1 | 8/2001 | Tavkhelidze et al. |
| 6,417,060 | B2 | 7/2002 | Tavkhelidze et al. |
| 6,495,843 | B1 | 12/2002 | Tavkelidze |
| 6,509,669 | B1 | 1/2003 | King et al. |
| 6,531,703 | B1 | 3/2003 | Tavkhelidze |
| 6,651,760 | B2 | 11/2003 | Cox et al. |
| 6,680,214 | B1 | 1/2004 | Tavkhelidze et al. |
| 6,720,704 | B1 | 4/2004 | Tavkhelidze et al. |
| 6,774,003 | B2 | 8/2004 | Tavkhelidze et al. |
| 2003/0042819 | A1 | 3/2003 | Martinovsky et al. |
| 2003/0111516 | A1 | 6/2003 | Ghoshal |
| 2004/0195934 | A1 | 10/2004 | Tanielian |
| 2005/0016575 | A1* | 1/2005 | Kumar et al. ............... 136/205 |
| 2005/0161072 | A1* | 7/2005 | Esser et al. ................. 136/205 |
| 2006/0162761 | A1 | 7/2006 | Tanielian |
| 2006/0162766 | A1* | 7/2006 | Gee et al. ................... 136/256 |

FOREIGN PATENT DOCUMENTS

| | | |
|---|---|---|
| WO | WO9826880 | 6/1998 |
| WO | WO 99/13562 | 3/1999 |

* cited by examiner

DUAL GAP THERMO-TUNNELING APPARATUS AND METHODS

GOVERNMENT LICENSE RIGHTS

This invention was made with U.S. Government support under U.S. Government Contract MDA972-03-2-0003 awarded by the Defense Advanced Research Projects Agency. The U.S. Government has certain rights in this invention.

FIELD OF THE INVENTION

This invention relates to thermoelectric devices, and more specifically, to dual gap thermo-tunneling apparatus and methods.

BACKGROUND OF THE INVENTION

Thermoelectric devices convert temperature gradients into electricity and vice versa. Solid state thermal engine technology is based on thermionics. Thermionics originated nearly a century ago with a basic vacuum tube, a device that consists of two parallel conductive plates (a high temperature cathode and a low temperature anode) separated by a vacuum gap. During operation, electrons boil off the cathode, traverse the gap and then are absorbed into the colder anode, resulting in a net current between the anode and the cathode.

A conventional figure of merit for thermoelectric devices is the ZT factor, which takes into account the thermal power, electrical conductivity, thermal conductivity and temperature of the device. For many years, the ZT factor of traditional thermoelectric devices has been on the order of 1. Recent advances by the Research Triangle Institute have improved the ZT factor of certain devices up to approximately 2 to 2.5, as disclosed, for example, in U.S. Pat. No. 6,722,140 issued to Venkatasubramanian. Although desirable improvements in the ZT factor of thermoelectric devices have been achieved, in order to make thermoelectric devices more competitive with other types of power generation and cooling systems, further improvement may be needed.

SUMMARY OF THE INVENTION

The present invention provides dual gap thermo-tunneling apparatus and methods. Embodiments of the present invention may advantageously improve the efficiency of the energy transfer and the ZT factor of thermoelectric devices, allowing such devices to be more competitive with other types of power generation and cooling systems.

In one embodiment, a thermoelectric device includes a first substrate portion having a first p-type conductive portion electrically coupled to a first n-type conductive portion, and a second substrate portion having a second p-type conductive portion and a second n-type conductive portion, the second substrate portion being positioned proximate to the first substrate portion such that the first and second p-type conductive portions are approximately aligned and the first and second n-type conductive portions are approximately aligned, wherein the first and second p-type conductive portions are spaced apart to form a first gap, and the first and second n-type conductive portions are spaced apart to form a second gap.

BRIEF DESCRIPTION OF THE DRAWINGS

Embodiments of the present invention are described in detail below with reference to the following drawings.

DETAILED DESCRIPTION

The present invention relates to dual gap thermo-tunneling apparatus and methods. Many specific details of certain embodiments of the invention are set forth in the following description and in FIGS. 1-5 to provide a thorough understanding of such embodiments. The present invention may have additional embodiments, or may be practiced without one or more of the details described for any particular described embodiment.

In general, an improved thermoelectric device in accordance with the present invention includes tunneling to assist in the transfer of thermal energy between the hot side and cold side of the device, and thermal isolation to increase the amount of electrical energy generated. A first gap is formed between a pair of p-type conductors, and a second gap is formed between a pair of n-type conductors. The first and second gaps are adapted to provide thermally-driven electron tunneling (e.g. on the order of a 1-2 nm in size) so that an electron current may be generated across the gaps while having essentially vacuum in between. More specifically, by applying a temperature differential, a flow of electrons may be formed across the gap between the n-type conductors, and a flow of holes may be formed across the gap between the p-type conductors, creating a net electrical current through the device.

The use of paired p-type/n-type electrical conductors allows the attachment of electrodes solely to the cold side of the thermoelectric device. One electrode is connected to a p-type conductor, and one electrode is connected to an n-type conductor. The p-type and n-type conductors may be formed of any suitable metals or semiconductor materials. The attachment of electrodes solely to the cold side of the thermoelectric device eliminates the thermal shorting that occurs in devices where electrodes or electrical connections must be maintained on the hot side of the thermoelectric device.

Additional thermal isolation to maintain a relatively large ΔT for a thermoelectric device may be achieved via the use of paired p-type/n-type electrical conductors in conjunction with channels formed adjacent to the gaps in intermediate portions of the substrates. Thus, embodiments of thermoelectric devices that utilize thermal isolation channels in conjunction with p-type/n-type conductors may advantageously provide improved thermal isolation and allow relatively larger ΔT to be maintained between the hot and cold surfaces of the device in comparison with prior art devices.

Figure 1:
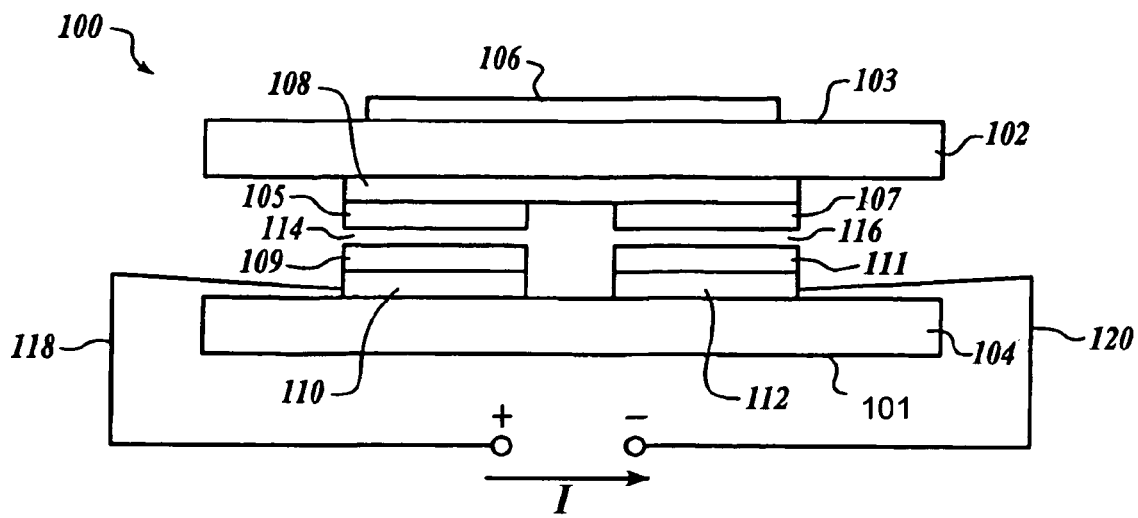
FIG. 1 is an elevational view of a dual gap p-type/n-type thermoelectric device in accordance with an embodiment of the invention.

FIG. 1 is an elevational view of a thermoelectric device 100 in accordance with an embodiment of the invention. The thermoelectric device 100 includes first and second substrates 102, 104. The first substrate 102 includes a hot side 103 and the second substrate 104 includes a cold side 105. The substrates 102, 104 may be formed of an electrically non-conductive material (or non-electrically conductive material), such as glass, ceramic or other suitable matrix material. A thermally conductive portion 106 is formed on the hot side 103 of the first substrate 102. The thermally conductive portion 106 may serve to more evenly distribute the applied heat load across the first substrate 102. A first ohmic contact 108 is formed on an inner surface of the first substrate 102. Similarly, second and third ohmic contacts 110, 112 are formed in a spaced-apart arrangement on an inner surface of second substrate 104.

As further shown in FIG. 1, a first p-type conductive portion 105 is formed on the first ohmic contact 108, and a first n-type conductive portion 107 is also formed on the ohmic contact 108 at a location spaced-apart from the first p-type conductive portion 105. Similarly, a second p-type conductive portion 109 is formed on the second ohmic contact 110, and a second n-type conductive portion 111 is formed on the third ohmic contact 112. The second substrate 104 is positioned with respect to first substrate 102 so that a second p-type conductive portion 109 is approximately aligned with first p-type conductive portion 105, and is spaced apart to form a first gap 114, and the second n-type conductive portion 111 is approximately aligned with and spaced apart from the first n-type conductive portion 107 to form a second gap 116. A first electrode 118 is connected to the second ohmic contact 110, and a second electrode 120 is connected to third ohmic contact 112.

In some embodiments, the first and second gaps 114, 116 may each be evacuated such that a reduced pressure or an approximate vacuum exists in the gaps. Methods of forming vacuum gaps that are co-extensive with the adjacent electrical conductive portions are described in co-pending, commonly-owned U.S. patent application Ser. No. 10/652,449 entitled "Solid State Thermal Engine" by Tanielian, which application is incorporated herein by reference.

Figure 2:
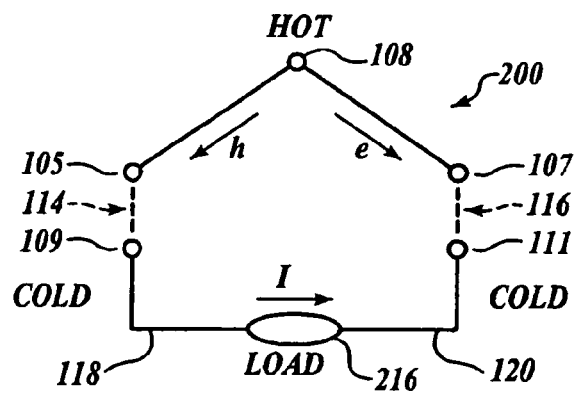
FIG. 2 is a diagram of electron flow in a dual gap p-type/n-type thermoelectric device in accordance with an embodiment of the invention.

FIG. 2 is a diagram 200 of a current flow I for the thermoelectric device 100 of FIG. 1. In operation, the thermoelectric device 100 may be subjected to a temperature differential, creating the hot side 103 and the cold side 105. In both the p-type conductive portions 105, 109 and n-type conductive portions 107, 111, electrons from the hot side have higher energy, and thus tunnel across the first and second gaps 114, 116 to the cold side. Of course, there is a finite probability that electrons may tunnel from the cold side 105 to the hot side 103, but on the average, more hot electrons will tunnel to the other side than cold electrons. As shown in FIG. 2, the electron tunneling results in an electron flow e that effectively sets up a current across the second gap 116 between the first and second n-type conductive portions 107, 111. Similarly, the electron tunneling results in a conduction (or flow) of holes h across the first gap 114 between the first and second p-type conductive portions 105, 109. Since holes are collective motions of electrons that can be described as positive carrier, the net current I is the sum of the two currents across the first and second gaps 114, 116. The net current I is collected by the first and second electrodes 118, 120 connected to the second and third ohmic contacts 110, 112, respectively, and is transferred to a matched load 216.

The magnitude of the net current I scales directly with the temperature differential ($\Delta T$) between the hot and cold sides. The higher the $\Delta T$, the more electrical energy can be transferred between the two electrodes 118, 120. Maintenance of a large $\Delta T$ can also increase the efficiency of the energy transfer.

Although not intending to be bound by theory, the maximum possible thermal efficiency of a thermal conversion system is generally given by the Carnot efficiency $\eta_C$. The Carnot efficiency $\eta_C$ for energy transfer between two reservoirs, one at $T_1$ and one at $T_2$ is given by the following Equation (1):

$$\eta_C = \frac{T_1 - T_2}{T_1} \tag{1}$$

Thus, the closer the $\Delta T$ between the hot and cold side is to the $T_1$-$T_2$ difference between the two reservoirs, the higher the efficiency of the energy transfer. In an actual thermoelectric device, however, only a fraction of the ideal Carnot efficiency $\eta_C$ may be achieved because of alternate energy paths available. In alternate embodiments of the present invention, additional aspects may improve the efficiency of the energy transfer, as described more fully below.

Figure 3:
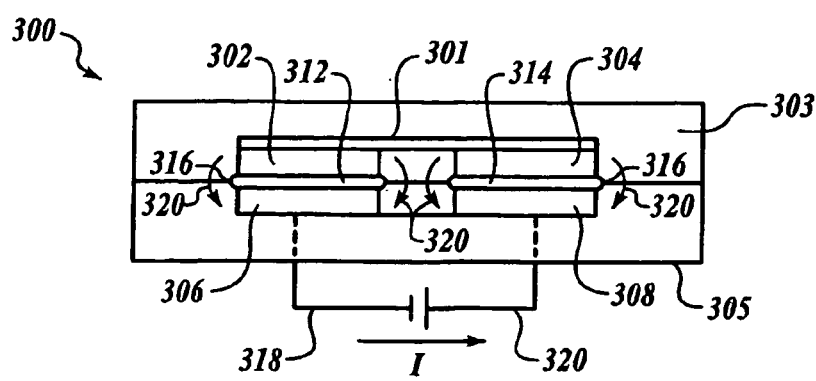
FIG. 3 is an elevational view of a dual gap p-type/n-type thermoelectric device equipped thermal isolation trenching in accordance with another embodiment of the invention.

For example, FIG. 3 shows a thermoelectric device 300 in accordance with another embodiment of the invention. In this embodiment, the thermoelectric device 300 includes a first (or hot) substrate 303 having a conductive portion 301 formed thereon, and a first p-type conductor 302 and a first n-type conductor 304 formed on the conductive portion 301. A second (or cold) substrate 305 has a second p-type conductor 306 and a second n-type conductor 308 formed thereon. The first and second p-type conductors 302, 306 are spaced apart to form a first gap 312 therebetween, and the first and second n-type conductors 304, 308 are spaced apart to form a second gap 314 therebetween. The first and second substrates 303, 305 are intimately bonded, as well as the paired electrodes 302, 306 and 304, 308. Once bonded, a voltage is applied across the paired electrodes to create a gap between the electrodes due to electromigration and Joule heating. A first conductive member 318 is coupled to the second p-type conductor 306, and a second conductive member 320 is coupled to the second n-type conductor 308 through vias formed in the first and second substrates 303, 305.

As further shown in FIG. 3, a channel or trench 316 is formed adjacent to at least a portion of the periphery of the first and second gaps 312, 314. As described more fully in co-pending, commonly-owned U.S. patent application Ser. No. 11/044,154, which application is incorporated herein by reference, thermal leakage 320 through the surrounding thermally insulating matrix in the vicinity of the first and second gaps 312, 314 from the hot substrate 303 to the cold substrate 305 will have to go around the channels 316 and thus have a much longer path, resulting in much lower thermal leakage between the hot substrate and the cold substrate. The channels 316 adjacent the first and second gaps 312, 314 may therefore advantageously reduce thermal leakage through the first and second substrates 303, 305, thereby improving the overall efficiency of the device 300.

As described more fully in the above-incorporated application, a variety of different configurations of channels 316 may be conceived. For example, in one embodiment, the channels 316 may be formed around the entire peripheral edge of the first and second gaps 312, 314 between the n-type and p-type conductive portions. Alternatively, the channels 316 may be formed only partially around the first and second gaps 312, 314, or even around only one of the first and second gaps 312, 314.

In further embodiments, the channels 316 may be approximately the same thickness as the first and second gaps 312, 314, or alternatively, may be considerably larger than the thicknesses of the first and second gaps 312, 314. Of course, additional alternate embodiments of channels 316 may be conceived.

Figure 4:
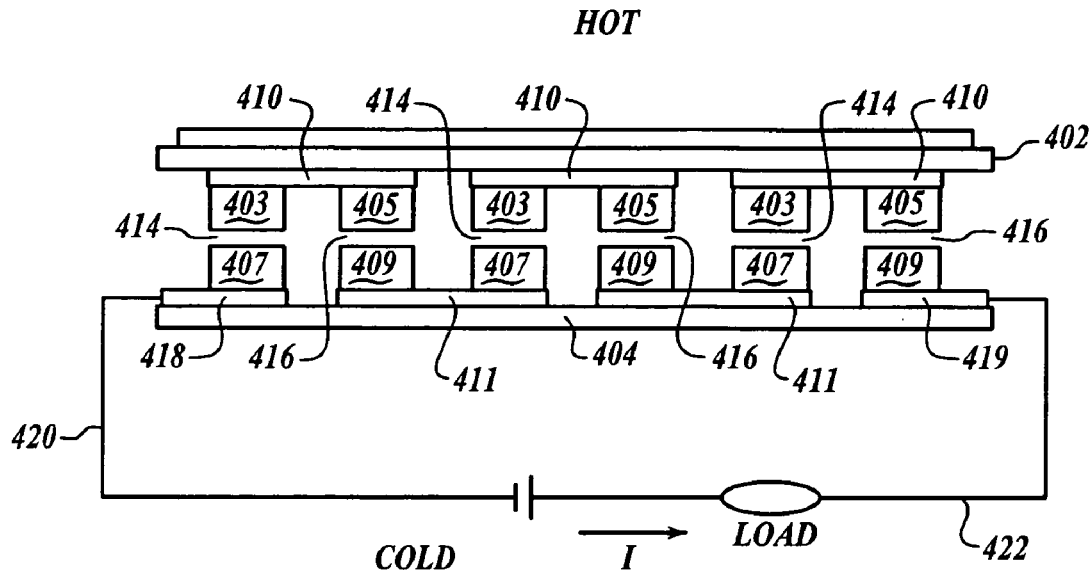
FIG. 4 is an elevational view of a thermoelectric device with a plurality of gaps and plurality of p-type/n-type conductors in accordance with a further embodiment of the invention.

FIG. 4 is an elevational view of a thermoelectric device 400 in accordance with another alternate embodiment of the invention. In this embodiment, the thermoelectric device 400 includes a first substrate 402 and a second substrate 404. The first substrate 402 is the hot side of the thermoelectric device 400, and the second substrate 404 is the cold side of the thermoelectric device 400. A thermally conductive portion 416 at least partially spans the first substrate 402 and serves to better distribute the applied heat load across the first substrate 402. A plurality of first ohmic contacts 410 are present on the inner surface of first substrate 402, and a plurality of second ohmic contacts 411 are present on the inner surface of the second substrate 404. A pair of p-type and n-type conductive portions 403, 405 are disposed on each of the first ohmic contacts 410, such that the p-type and n-type conductive portions 403, 405 of each pair are electrically connected via the associated ohmic contact 410. Corresponding pairs of p-type and n-type conductive portions 407, 409, are disposed on the second ohmic contacts 411 such that the n-type conductive portion 409 of a first pair is electrically connected with the p-type conductive portion 407 of an adjacent or neighboring pair via the ohmic contacts 411, allowing a serial flow of electrical current through successive n-type/p-type pairs. A plurality of first gaps 414 are formed between the first and second p-type conductive portions 403, 407, and a plurality of second gaps 416 are formed between the first and second n-type conductive portions 405, 409. A first electrode 420 is attached to a first terminal ohmic contact (or p-type conductive portion) 418 on the second substrate 404, and a second electrode 422 is attached to a second terminal ohmic contact (or n-type conductive portion) 419 on the second substrate 404 such that an electrical current I may flow through the electrodes 420, 422 and a load.

Figure 5:
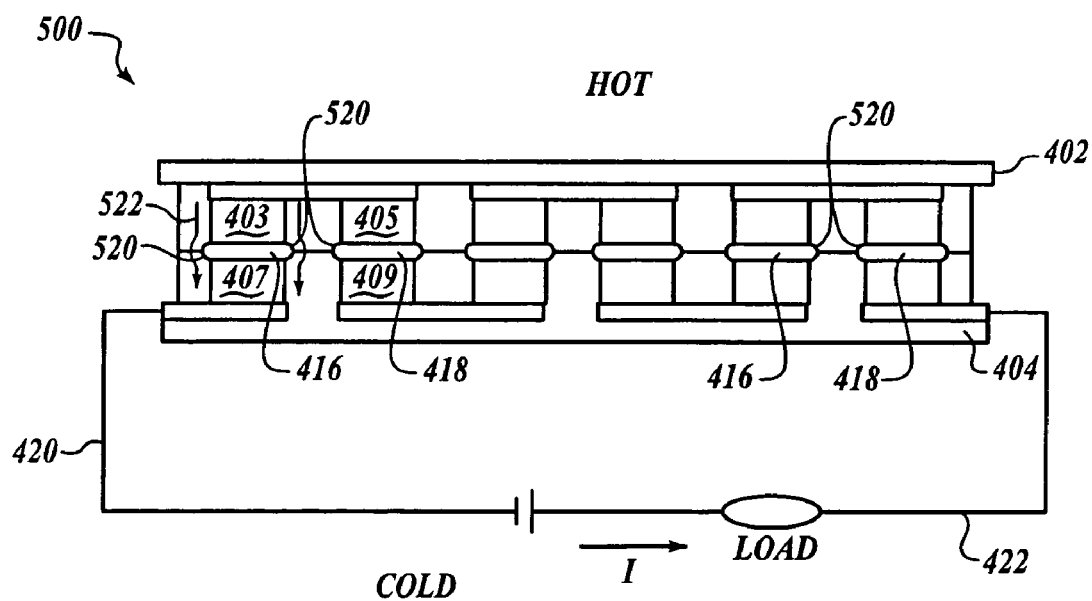
FIG. 5 is an elevational view of a thermoelectric device with a plurality of gaps and plurality of p-type/n-type conductors that is also equipped with thermal isolation trenching in accordance with another embodiment of the invention.

FIG. 5 is an elevational view of a thermoelectric device 500 in accordance with a further embodiment of the invention. The thermoelectric device 500 shown in FIG. 5 includes many of the same components as the thermoelectric device 400 shown in FIG. 4, and for the sake of brevity, a description of those components will not be repeated. In addition to the components described above with reference to FIG. 4, in this embodiment, the thermoelectric device 500 includes a plurality of channels or trenches either completely or partially surrounding the electrode area, as described above with respect to FIG. 3, adjacent at least some of the first gaps 416 between the first and second p-type conductive portions 403, 407, and adjacent at least some of the second gaps 418 between first and second n-type conductive portions 405, 409. Thermal leakage 522 from the hot substrate 402 to the cold substrate 404 will have to go around the channels 520 and thus have an increased path, resulting in reduced thermal leakage 522 than would otherwise exist between the hot substrate 402 and the cold substrate 404.

Embodiments of the present invention may provide significant advantages over the prior art. For example, because embodiments of the present invention use p-type and n-type conductors, the flow of electrons across the gaps may be increased, thereby increasing the net current I created by the thermoelectric device. Also, the use of paired p-type/n-type electrical conductors allows the attachment of electrodes solely to the cold side of the thermoelectric device. Furthermore, having channels adjacent to at least some of the gaps between the p-type conductors and the n-type conductors, the channels may advantageously decrease the thermal leakage that occurs through the substrate. By reducing thermal leakage, the $\Delta T$ between the first and second substrates may be closer to the $T_1$-$T_2$ difference between the two reservoirs, thereby improving the efficiency of the energy transfer of the thermoelectric device. Embodiments of the present invention may provide improvements in the ZT factor of thermoelectric devices in comparison with prior art devices, and may improve the overall competitiveness of thermoelectric devices with other types of power generation and cooling systems.

While preferred and alternate embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A thermoelectric device, comprising:
  a first substrate portion, a first ohmic contact on the first substrate portion, a first p-type conductive portion on the first ohmic contact and a first n-type conductive portion on the first ohmic contact, the first p-type portion electrically coupled to the first n-type conductive portion;
  a second substrate portion, a second ohmic contact on the second substrate portion, a second p-type conductive portion on the second ohmic contact and a second n-type conductive portion on the second ohmic contact, the second substrate portion being positioned proximate to the first substrate portion such that the first and second p-type conductive portions are approximately aligned and the first and second n-type conductive portions are approximately aligned; and
  wherein the first and second p-type conductive portions are spaced apart to form a first gap, and the first and second n-type conductive portions are spaced apart to form a second gap, the first and second gaps being sized to allow thermally-driven electron tunneling that results in conduction of electrons across the gap between the n-type portions and conduction of holes across the gap between the p-type portions, whereby a net current flows between the ohmic contacts.

2. The thermoelectric device of claim 1, wherein at least one of the first and second p-type conductive portions comprises a p-type semi-conductor, and wherein at least one of the first and second n-type conductive portion comprises an n-type semi-conductor.

3. The thermoelectric device of claim 1, wherein the first and second gaps are vacuum gaps.

4. The thermoelectric device of claim 1, further comprising an intermediate substrate portion substantially surrounding the first and second p-type conductive portions and the first and second n-type conductive portions, wherein the intermediate portion includes at least one channel formed therein and positioned adjacent at least one of the first and second gaps.

5. The thermoelectric device of claim 4, wherein the at least one channel includes a first channel formed around a periphery of the first gap, and a second channel formed around a periphery of the second gap.

6. A thermoelectric device, comprising:
  a first non-electrically conducting member having a plurality of pairs of conductive portions disposed thereon, wherein each pair of conductive portions includes a p-type conductive portion and an n-type conductive portion, and the n-type conductive portion and the p-type conductive portion of each pair are electrically connected;

a second non-electrically conducting member having a plurality of pairs of conductive portions disposed thereon, wherein each pair of conductive portions includes a p-type conductive portion and an n-type conductive portion, and the p-type conductive portion of each pair being electrically connected with the n-type conductive portion of a successive pair;

the first non-electrically conducting member being positioned proximate to the second non-electrically conducting member such that the p-type conductive portions of the first and second non-electrically conducting members are aligned and spaced apart to form a plurality of first gaps between the p-type conductive portions, and such that the n-type conductive portions of the first and second non-electrically conducting members are aligned and spaced apart to form a plurality of second gaps between the n-type conductive portions, the first and second gaps having a size of 1 to 2 nanometers.

7. The thermoelectric device of claim 6, wherein the first gaps between the plurality of p-type conductive portions are adapted to allow electron tunneling, and wherein the second gaps between the plurality of n-type conductive portions are adapted to allow electron tunneling.

8. The thermoelectric device of claim 6, wherein at least one of the p-type conductive portions comprises a p-type semi-conductor, and at least one of the n-type conductive portion comprises an n-type semi-conductor.

9. The thermoelectric device of claim 6, wherein the p-type conductive member and the n-type conductive portions are alternately disposed on the first non-electrically conducting portion, and the p-type conductive portions and n-type conductive portions are alternately disposed on the second non-electrically conducting member.

10. The thermoelectric device of claim 6, further comprising an intermediate portion disposed between the first and second members and substantially surrounding the first and second p-type conductive portions and the first and second n-type conductive portions, wherein the intermediate portion includes at least one channel formed therein and positioned adjacent at least one of the first and second gaps.

11. The thermoelectric device of claim 10, wherein at least one channel includes a first channel formed around a periphery of the first gap, and a second channel formed around a periphery of the second gap.

12. The device of claim 1, wherein each gap is formed by applying a voltage or current between its two aligned conductive portions.

13. The device of claim 6, wherein each gap is formed by applying a voltage or current between its two aligned conductive portions.

* * * * *